(12) United States Patent
Meltaus et al.

(10) Patent No.: US 10,320,361 B2
(45) Date of Patent: *Jun. 11, 2019

(54) WIDE-BAND ACOUSTICALLY COUPLED THIN-FILM BAW FILTER

(71) Applicant: Teknologian tutkimuskeskus VTT Oy, Espoo (FI)

(72) Inventors: Johanna Meltaus, Espoo (FI); Tuomas Pensala, Helsinki (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 14/810,481

(22) Filed: Jul. 28, 2015

(65) Prior Publication Data
US 2015/0333730 A1    Nov. 19, 2015

Related U.S. Application Data

(63) Continuation of application No. 13/642,155, filed as application No. PCT/FI2011/050368 on Apr. 21, 2011, now Pat. No. 9,294,069.

(30) Foreign Application Priority Data

Apr. 23, 2010   (FI) .................... 20105443

(51) Int. Cl.
*H03H 9/56* (2006.01)
*H03H 9/02* (2006.01)
(Continued)

(52) U.S. Cl.
CPC .... *H03H 9/02228* (2013.01); *H03H 9/02007* (2013.01); *H03H 9/175* (2013.01);
(Continued)

(58) Field of Classification Search
CPC ............ H03H 9/0095; H03H 9/02007; H03H 9/02228; H03H 9/177; H03H 9/564
(Continued)

(56) References Cited

U.S. PATENT DOCUMENTS 6,448,695 B2   9/2002  Milsom
6,586,861 B2 * 7/2003  Misu ..................... H03H 3/04
                                                           310/324
(Continued)

FOREIGN PATENT DOCUMENTS

EP   1575165 B1   9/2005
EP   1871007 B1  12/2007
(Continued)

OTHER PUBLICATIONS

Pensala et al., "An Eigenmode Superposition Model for Lateral Acoustic Coupling Between Thin Film BAW Resonators", 2008, IEEE International Ultrasonics Symposium Proceedings, p. 1540-1543.*

(Continued)

*Primary Examiner* — Dean O Takaoka
*Assistant Examiner* — Alan Wong
(74) *Attorney, Agent, or Firm* — Seppo Laine Oy

(57) ABSTRACT

In a bulk acoustic wave (BAW) filter based on laterally acoustically coupled resonators on piezoelectric thin films, one can utilize two distinct acoustic plate wave modes of different nature, for example the thickness extensional (longitudinal) TE1 and the second harmonic thickness shear (TS2) mode to form a bandpass response. The invention is based on the excitation of at least two lateral standing wave resonances belonging to different plate wave modes that facilitate the transmission of signal. The passband is designed by tailoring the wave propagation characteristics in the device such that the resonances are excited at suitable (Continued)

frequencies to form a passband of a desired shape. The bandwidth of the filter described herein may therefore be more than twice that of the existing state-of-the-art microacoustic filters. Consequently, it has significant commercial and technological value.

10 Claims, 8 Drawing Sheets

(51) Int. Cl.
H03H 3/04 (2006.01)
H03H 9/205 (2006.01)
H03H 9/17 (2006.01)
H03H 9/58 (2006.01)
H03H 9/00 (2006.01)

(52) U.S. Cl.
CPC ............ *H03H 9/177* (2013.01); *H03H 9/205* (2013.01); *H03H 9/564* (2013.01); *H03H 9/584* (2013.01); *H03H 9/0095* (2013.01); *H03H 9/02125* (2013.01); *H03H 2003/0414* (2013.01); *Y10T 29/42* (2015.01)

(58) Field of Classification Search
USPC .................................. 333/187–192
See application file for complete search history.

(56) References Cited

U.S. PATENT DOCUMENTS

| 6,975,183 | B2 | 12/2005 | Aigner et al. |
| 7,057,478 | B2 | 6/2006 | Korden et al. |
| 7,098,758 | B2 | 8/2006 | Wang |
| 7,248,132 | B2 | 7/2007 | Milsom et al. |
| 7,466,213 | B2 | 12/2008 | Löbl et al. |
| 8,409,996 | B2* | 4/2013 | Vanhelmont ............ H03H 3/04 216/13 |
| 9,219,466 | B2* | 12/2015 | Meltaus ................ H03H 9/564 |
| 9,294,069 | B2* | 3/2016 | Meltaus ............ H03H 9/02228 |
| 2006/0214747 | A1 | 9/2006 | Lakin |
| 2008/0079515 | A1 | 4/2008 | Ayazi et al. |
| 2008/0129414 | A1 | 6/2008 | Lobl et al. |
| 2008/0180193 | A1 | 7/2008 | Iwasaki et al. |
| 2009/0002098 | A1 | 1/2009 | Mayer et al. |

FOREIGN PATENT DOCUMENTS

| EP | 1826901 B1 | 11/2013 |
| JP | 2006191356 A | 7/2006 |
| JP | 2008206139 A | 9/2008 |
| WO | WO 2006062082 A1 | 6/2006 |

OTHER PUBLICATIONS

B.A. Auld, "Acoustic Fileds and Waves in Solids", 2nd Edition, vol. 2, Krieger Publishin Company, Malabar, Florida (1990), relevant pages.

Chung, et al.; "Superior Dual Mode Resonances for ¼ Solidly Mounted Resonators"; 2008 IEEE.

G.G. Fattinger, S. Marksteiner, J. Kaitila, R. Aigner "Optimization of acoustic dispersion for high performance thin film BAW resonators", in Proc. 2005 IEEE Ultrasonics Symposium, pp. 1175-1178 (2005).

Meltaus et al. "Laterally coupled solidly mounted BAW resonators at 1.9 GHz". In: IEEE 2009 International Ultrasonic Symposium Proceedings, Sep. 20-23, 2009, pp. 847-850.

Pensala, et al.; "An Eigenmode Superposition Model for Lateral Acoustic Coupling Between Thin Film BAW Resonators"; 2008 IEEE International Ultrasonics Symposium Proceedings.

* cited by examiner

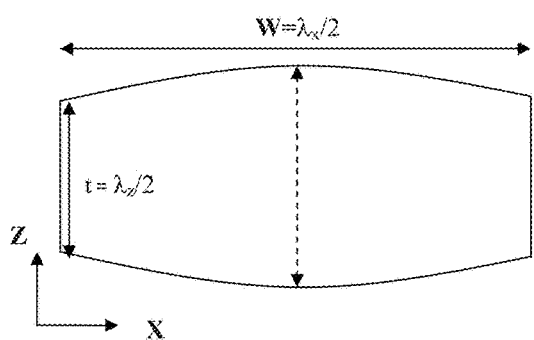
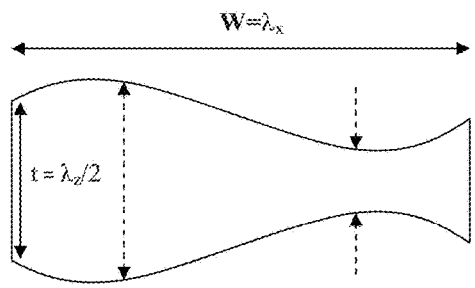
Fig. 2A                         Fig. 2B
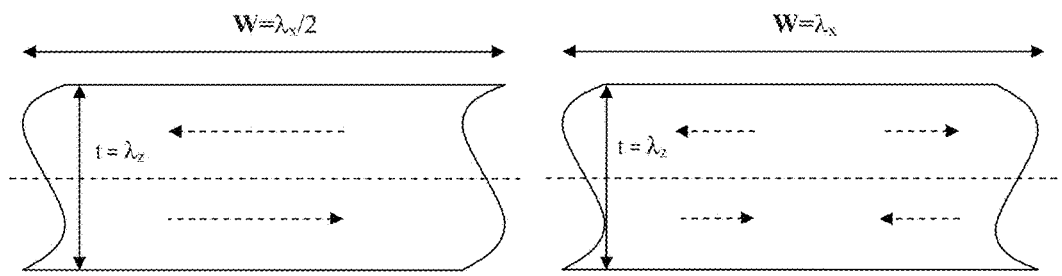
Fig. 2C                         Fig. 2D

WIDE-BAND ACOUSTICALLY COUPLED THIN-FILM BAW FILTER

FIELD OF INVENTION

The present invention relates generally to bulk acoustic wave (BAW) filters. More specifically, to wide-band acoustically coupled bulk acoustic wave filters. In particular, to those operating at GHz frequencies and based on thin-film technology and piezoelectric thin films.

BACKGROUND OF THE INVENTION

Some central concepts used in the following text are briefly defined here.

Laterally Propagating Plate Wave Modes

Bulk acoustic thickness vibration arising in a piezoelectric plate (a wafer or a thin film layer) can propagate laterally (in the horizontal direction) in the plate. Such laterally propagating wave modes are called plate wave modes or Lamb wave modes [1]. The term plate wave mode will be used here. The wave propagates with a lateral wavelength $\lambda_x$ and has a lateral wave number $k_x$.

Different types of thickness vibration can propagate as plate waves. Examples of such vibration types are the thickness-extensional (TE) and thickness-shear (TS) vibration (FIG. 1). In the former, the particle displacement is in the thickness direction of the piezoelectric plate (z-axis in FIG. 1), and in the latter, it is perpendicular to the thickness direction. A thickness resonance arises within the piezoelectric plate when the thickness t of the plate is equal to an integer number of half-wavelengths $\lambda_z$: $t=N\lambda_z/2$, $\lambda_z=v/f$, where N is an integer, v is the velocity of the acoustic wave in the piezoelectric material, and f is the operation frequency. In the first-order mode, N=1 and there is one half-wavelength accommodated within the thickness t.

In FIG. 1, some plate wave types are depicted. From top to bottom: the first-order thickness-extensional mode TE1, the second-order thickness-shear mode TS2, the first-order thickness-shear mode TS1, flexural mode. Propagation is in the lateral direction with lateral wavelength $\lambda_x$.

Lateral Standing Wave Resonances

Laterally propagating plate waves can be reflected from discontinuities, such as electrode edges. In a laterally finite structure, therefore, lateral standing wave resonances can arise. A lateral standing wave resonance arises when the lateral dimension W of the finite structure equals an integer number of half-wavelengths $\lambda_x$ of the lateral propagation: $W=N\lambda_x/2$. The integer N implies the order of the resonance. In the first order resonance, there is one half-wavelength within the lateral length of the structure.

Lateral standing wave resonances can arise for any thickness vibration mode (e.g., TE mode or TS mode).

In FIG. 2, the first two lateral standing wave resonances in a laterally finite plate with width W and thickness t are shown for the TE1 and the TS2 thickness vibration modes (plate wave modes). The first resonances (2a and 2c) have a lateral wavelength of $\lambda_x=2W$ are symmetric in the width of the plate while the second resonances have a lateral wavelength $\lambda_x=W$ (2b and 2d) are antisymmetric in the width of the plate.

Dispersion Diagrams

Relation between the lateral wave number $k_x$ of a laterally propagating plate wave and the frequency f is called the dispersion of the plate wave and is presented as a dispersion diagram. In a dispersion diagram, negative x-axis often corresponds to imaginary wave number (evanescent wave), whereas positive x-axis corresponds to real wave number (propagating wave).

In FIG. 3, a calculated dispersion diagram is shown. Second-order thickness shear (TS2) and first-order thickness extensional (TE1) plate wave modes are denoted.

Electrical Coupling of Resonance Modes

Mechanical vibration in a piezoelectric film produces an electrical field. For this field to create voltage between the electrodes of a resonator, it needs to be such that the total charge over the electrode is not zero.

Acoustical Coupling

Mechanical vibration can couple mechanically from one resonator structure to another. Mechanical coupling can happen via an evanescent wave or via a propagating wave.

General Description of Related Art

Radio-frequency (RF) components, such as resonators and filters, based on microacoustics and thin-film technology are currently widely used in radio applications, such as mobile phones, wireless networks, satellite positioning, etc. Their advantages over their lumped-element counterparts include small size and mass-producibility. Two principal microacoustic technologies used for RF devices are surface acoustic wave (SAW) and bulk acoustic wave (BAW) technologies.

In this section, existing filter technologies are briefly introduced to provide background for the current invention and to distinguish the invention from the prior art.

Surface Acoustic Wave Devices

Interdigital transducers (IDTs)—comb-like structures of thin-film metal strips, see FIG. 4—are patterned on a piezoelectric substrate (e.g., quartz, $LiNbO_3$ or $LiTaO_3$). The IDTs are used to transform the electric input signal $V_{in}$ into a surface-propagating acoustic wave via the piezoelectric effect, as well as to pick up the acoustic signal at the output port and transform it back to electrical form. The operation frequency of the device depends on the velocity of the acoustic wave and the dimensions of the IDT electrodes via $f=2p/v$, where f is the frequency, p is the period of the IDT, and v is the velocity of the surface wave. Therefore, higher operation frequencies require smaller p if the velocity is kept constant.

Bulk Acoustic Wave Devices

In a BAW device, acoustic vibration inside a piezoelectric wafer or a thin film is used to process the electrical input signal. In a solidly-mounted BAW resonator (SMR), an acoustic reflector composed of alternating high and low acoustic impedance (Z) material layers serves to isolate the vibration in the piezoelectric thin film from the substrate and to prevent acoustic leakage. In a membrane device the same is accomplished by fabricating and air gap between the piezoelectric resonator and the substrate.

Thickness Vibration and Plate Wave Dispersion

As explained above, in the piezoelectric layer, different thickness vibration modes, such as longitudinal (also called thickness-extensional, vibration is in the thickness direction, parallel to z-axis) and shear (vibration perpendicular to z-axis) vibration, arise as the excitation frequency f is swept. Such thickness vibration can propagate in the lateral direction as a plate wave. Acoustic properties of the plate waves can be described with dispersion curves, in which the lateral (perpendicular to z-axis) wave number $k_x$ of the plate wave is presented as a function of frequency f.

FIG. 3 shows calculated dispersion diagram for the thin-film layer stack given in Table 1. The dispersion curves of the laterally-propagating plate waves for the first-order longitudinal (thickness extensional, TE1) vibration mode, in which the thickness of the piezoelectric layer contains approximately half a wavelength $\lambda_z$ of the thickness vibration, and for the second-order thickness shear (TS2) mode, in which the particle displacement is perpendicular to the thickness direction and one acoustic wavelength $\lambda_z$ is contained in the piezoelectric layer thickness, are denoted in the figure. This type of dispersion, in which the onset frequency of the TE1 plate mode is higher than the onset frequency of the TS2 plate mode, is called Type 1[2]. Onset means the point at which the dispersion curve of a plate mode crosses the $k_x=0$ axis (i.e. the frequency axis). Type 1 materials include, e.g., ZnO. Aluminum nitride is inherently Type 2 (TS2 is higher in frequency than TE1).

By designing the thin-film stack correctly, dispersion properties can be tailored and the dispersion type changed.

Table 1 is the film thicknesses used in the calculation of the dispersion curves in FIG. 2.

| Material | SiO2 | W | SiO2 | W | SiO2 | Ti | Mo | AlN | Al |
|---|---|---|---|---|---|---|---|---|---|
| Thickness (nm) | 790 | 505 | 620 | 510 | 950 | 10 | 360 | 1750 | 220 |

In FIG. 3, positive values of $k_x$ denote a real wave number (propagating wave) and negative values correspond to imaginary wave number (evanescent wave).

For a lateral standing wave resonance to arise in a laterally finite structure, the acoustic energy must be trapped inside the resonator structure, both in the thickness direction and in the lateral direction. In the thickness direction, isolation from the substrate (reflector or air gap) ensures the energy trapping. In the lateral direction, there should be an evanescent wave outside the resonator region for energy trapping. Energy trapping is easier to realize in Type 1 dispersion. Therefore, when using AlN as the piezoelectric material, the reflector is usually designed so that it converts the dispersion into Type 1.

In a laterally finite plate resonator, a propagating plate wave can form lateral standing wave resonances when the width W of the resonator accommodates an integer multiple of half-wavelengths, i.e. $W=N\lambda_x/2$.

Acoustical Coupling in BAW Devices

A filter can be made by electrically connecting one-port resonators to form a ladder or a lattice filter. Another possibility is to arrange mechanical (acoustic) coupling between resonators by placing them spatially close enough to each other for the acoustic wave to couple from one resonator to another. Such devices are called coupled resonator filters (CRF).

In BAW devices, vertical acoustic coupling between stacked piezoelectric layers is used in stacked crystal filters (SCF) and vertically coupled CRFs. In an SCF, two piezoelectric layers are separated by an intermediate electrode. In a vertically coupled CRF, coupling layers are used to modify the coupling strength between the piezoelectric layers. The CRF can be fabricated either using the SMR or the membrane technology.

A thin-film vertically coupled CRF has been shown to give a relatively wide-band frequency response (80 MHz at 1850 MHz center frequency, or 4.3% of center frequency). They also enable unbalanced-to-balanced (balun) conversion. The disadvantage of the vertically coupled CRFs is the need for a large number of layers and the sensitivity of the response to the thickness of the piezolayers. This makes the fabrication process difficult and consequently expensive.

Lateral acoustical coupling in BAW devices (LCRF) can be realized with 2 or more narrow electrodes placed close to each other on the piezoelectric layer. Electrical input signal into a first port formed by one or more electrodes is transformed into mechanical vibration via the piezoelectric effect. This vibration couples mechanically across the gap to a second port formed by one or more electrodes and creates an output electrical signal. Electrodes in this example are interdigital (comb-like), but other shapes are possible as well. Coupling strength is determined by the acoustic properties of the structure and by the gap between the electrodes.

Bandpass frequency response in an LCRF is typically formed by two lateral standing wave resonances arising in the structure. Typically one of the resonances forming the passband is the lowest-order (symmetric) lateral standing wave resonance for which N=1 and all electrodes are vibrating in-phase (see FIG. 7). Preferably the second resonance is the one for which every electrode is in the opposite phase with its neighbours (odd resonance mode) (see FIG. 7). The frequency difference between the lateral standing wave resonances determines the achievable bandwidth of the filter, and depends on the acoustic properties of the structure and on the electrode dimensions and the acoustical coupling strength between the electrodes.

Prior art describes LCRF structures using two lateral standing wave resonances arising for one plate wave mode, e.g., TE1, to form a bandpass response. Also, in the prior art, there has been identified unwanted spurious resonances and passbands at the frequency of other plate wave modes existing in the structure, e.g., TS2 mode. [3]

The main advantage of the LCRF over the vertical CRF is the simple fabrication technology, as only one piezoelectric layer and no coupling layers are required, as opposed to the vertical CRF. Operation at high frequencies is easier than for SAW components, as the operation frequency is mainly determined by the layer thicknesses, not the electrode dimensions, relaxing requirements for very narrow dimensions.

PRIOR ART REFERENCES

[1] B. A. Auld, *Acoustic Fields and Waves in Solids*, 2$^{nd}$ Edition, vol 2. Krieger Publishing Company, Malabar, Fla. (1990).

[2] G. G. Fattinger, S. Marksteiner, J. Kaitila, and R. Aigner, "Optimization of acoustic dispersion for high performance thin film BAW resonators", in Proc. 2005 IEEE Ultrasonics Symposium, pp. 1175-1178 (2005).

[3] Meltaus, J.; Pensala, T.; Kokkonen, K.; Jansman, A.; "Laterally coupled solidly mounted BAW resonators at 1.9 GHz,", in Proc. 2009 IEEE Ultrasonics Symposium, pp. 847-850, 2009.

SUMMARY OF THE INVENTION

The present invention concerns a wide-band acoustically coupled bulk acoustic wave (BAW) filter at GHz frequencies, based on thin-film technology and piezoelectric thin films.

Compared to prior art, in the current invention, at least two distinct plate wave modes are used instead of just one to create two or more lateral standing wave resonances which form the filter passband. Each plate wave mode contributes at least one lateral standing wave resonance.

An aspect of the present invention is to use two different laterally propagating thickness vibration modes (plate wave modes), e.g., shear and longitudinal vibration, together to produce a bandpass response. It is preferable that the acoustical properties of the structure are designed such that the two plate modes are at a desired frequency distance from each other. It is also preferable that electrical coupling to both can be provided.

More specifically, the invention is characterized by what is stated in the independent claims.

According to one aspect of the invention the acoustic filter comprises;
  a stack of materials suitable for an acoustic filter, the stack comprising at least one piezoelectric layer,
  at least two resonators having a width and a gap between them and comprising electrodes on different sides of the piezoelectric layer, where the electrodes on one side of the piezoelectric layer are separated to form at least two resonator regions, and the electrode on the other side of the piezoelectric layer is continuous,
  wherein
  the stack of materials, width and gap between the separated electrodes being adapted to produce at least two distinct plate wave modes having a total of at least two lateral standing wave resonances in the acoustic filter.

In particular, the stack of materials, width and gap between the separated electrodes may be adapted to produce at least two distinct acoustic plate wave modes each contributing at least one lateral standing wave resonance in the acoustic filter.

According to one embodiment, the electrodes on only one side of the piezoelectric layer are separated to form at least two resonator regions and the continuous electrode is provided on the other side of the piezoelectric layer.

According to one aspect of the invention the acoustic filter comprises
  a stack of materials suitable for an acoustic filter, the stack comprising at least one piezoelectric layer,
  at least two resonators having a width and a gap between them and comprising electrodes on different sides of the piezoelectric layer, where the electrodes on both sides of the piezoelectric layer are separated to form at least two resonator regions,
  wherein
  the stack of materials, width and gap between the electrodes on one side of the piezoelectric layer, and width and gap between the electrodes on the other side of the piezoelectric layer being adapted to produce at least two distinct plate wave modes having a total of at least two lateral standing wave resonances in the acoustic filter.

According to one aspect, at least two of the electrodes are electrically connected to provide a balanced electrical port.

Preferably, the at least two distinct acoustic plate wave modes comprise at least one longitudinal mode and at least one shear mode.

According to a further aspect of the invention, in the filter structure, at least one lateral standing wave resonance arises for both of the said plate wave modes. Therefore, in the simplest case, two lateral standing wave resonances contribute to the bandpass response. A further possibility is that at least two lateral resonance modes arise for one of the two distinct acoustic plate wave modes, and at least one lateral standing wave resonance arises for the other of the two distinct acoustic plate wave modes, yielding at least three lateral standing wave resonances. Preferably, at least two standing wave resonances arise for both of the said plate wave modes, yielding at least four lateral resonances.

According to a further aspect of the invention, when the structure is designed such that the electrical coupling and frequency differences of these lateral standing wave resonances are optimal, a (4-pole) bandpass response is obtained.

According to one embodiment, a TS2 plate wave branch is brought close enough in frequency to a TE1 branch, so that resonance modes arising within that branch for the filter passband can be used together with TE1 modes. It should be noted that in a BAW resonator, there is virtually no coupling to the shear wave modes. In an LBAW device, this coupling exists because of the lateral electric fields arising between the narrow electrodes. In a conventional LBAW filter, the shear mode may show up in the electrical response as the spurious band. According to the invention, this response is used together with the TE1 mode response to constitute a very wide passband, that would be made up of four resonance modes instead of two (even and odd mode of TS2 branch and even and odd mode of TE1 branch), as described in more detail later.

According to one aspect, the method of manufacturing an acoustic wide-band filter according to the invention comprises
  selecting a structure design and materials for the filter, designating a desired center frequency and bandwidth, wherein
  designing a stack using the selected structure design and materials along with a set of resonators having a width and gap between them so that coupling to at least two distinct laterally propagating thickness vibration plate wave modes is achieved having a total of at least two resonances, and
  fabricating the designed filter stack so that it couples the at least two distinct laterally propagating thickness vibration plate wave modes having a total of at least two resonances, each of the modes typically contributing at least one lateral standing wave resonance in the acoustic filter.

An advantage to using the present invention over the existing art is that by using, in even the simplest cases, i.e. three or four lateral standing wave resonances instead of only two, there is a significantly wider electrical frequency bandwidth (BW). Another advantage to using the design of the present invention is that there are less stringent requirements for acoustic and electromechanical coupling and layer thicknesses as compared to vertical BAW CRF and for lateral dimensions as compared to SAW, which leads to relaxed fabrication tolerances and costs. Third advantage is that one can eliminate an unwanted spurious response. When two plate wave modes are close to each other in frequency, and only one of them is used for the lateral standing wave resonances that form the bandpass response, the other plate wave mode may still produce lateral standing wave resonances which appear as unwanted spurious response. In the current invention, these resonances, previously regarded as unwanted, are used to create a wider passband.

According to finite element method (FEM) simulations, roughly 10% relative BW at 2 GHz is obtainable using the design of the present invention utilizing AlN based SMR technology. Comparatively, commercial component producers have surface acoustic wave (SAW) and BAW products that give only approximately 80 MHz (4%) band at 2 GHz. Therefore, the filter introduced in this invention has approximately two times the frequency bandwidth available in commercial state of the art microacoustic filters.

Additional advantages are; extremely wide frequency BW, possibility to operate at high frequencies (frequency is determined mainly by the film thicknesses, not by electrode dimensions, which means that lithography is not a principal limiting factor as for SAW components), relaxed fabrication requirements (e.g., width of gap between electrodes), relatively simple fabrication process (just one piezoelectric layer, compared to competing coupled resonator BAW technologies), small component size (compared to, e.g., SAW components), high out-of-band suppression (compared to, e.g., ladder BAW filters), and more freedom in acoustic design (than when using only one vibration mode).

The design of the present invention will now be described below in more detail with the aid of the description of exemplary embodiments.

BRIEF DESCRIPTION OF THE DRAWINGS

FIG. 2*a-b* show two lateral standing wave resonances for the First order thickness extensional vibration mode (TE1 plate wave mode) in a plate with finite width W.

FIG. 2*c-d* show two lateral standing wave resonances for the Second order thickness shear vibration mode (TS2 plate wave mode) in a plate with finite width W.

DETAILED DESCRIPTION OF EXEMPLARY EMBODIMENTS

Figure 4:
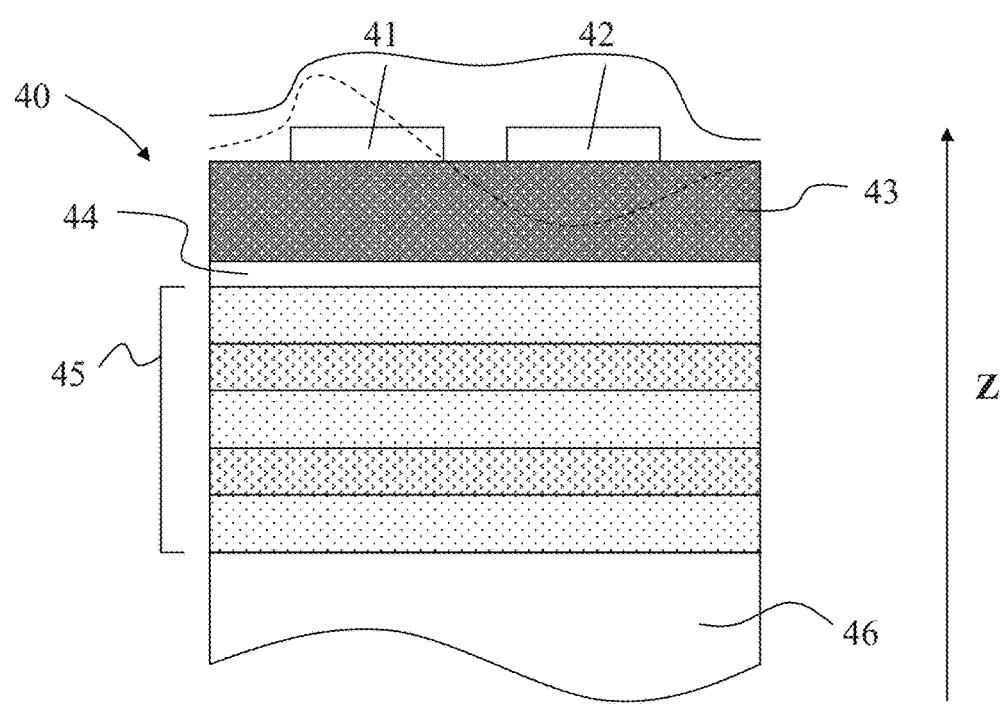
FIG. 4 shows a schematic cross-section of a two-electrode SMR LCRF structure.

The filter described here is based on the SMR LCRF structure shown in FIG. 4. Electrodes in this example are interdigital (comb-like) as shown in FIG. 5, but other geometries (such as circular) are possible as well.

FIG. 4 shows a schematic of a two-electrode SMR LCRF structure 40 stacked in the Z dimension. At the top of the structure there are two ports 41 and 42. The ports are fixed to piezo 43. Below the piezo is the electrode 44, the acoustic reflector 45 and the substrate 46. The electrode in the interdigital embodiment is shown as 50 in FIG. 5, with a period, p, shown by 52.

Figure 5:
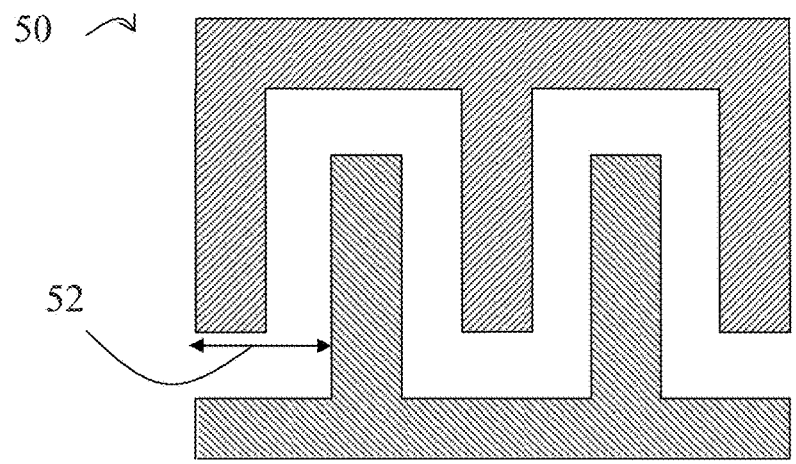
FIG. 5 shows an Interdigital transducer.

FIGS. 4 and 5 show a generic structure and are not meant to limit the present invention. For example, electrodes in the present invention do not need to be connected to input and output alternating, but one can have, for example, grounded or floating fingers in between. Also, electrode connections need not be regular, i.e., electrodes can be connected to ports in any necessary manner. There can also be more ports than two; for example, one input and two outputs (for balanced output), two inputs and one output (for balanced input), or two inputs and two outputs (balanced input and balanced output). Electrode width and gap width can vary within an electrode structure and material(s) are not limited to AlN and W/SiO2. For example; ZnO, PZT of some other suitable piezoelectric could be used as the piezoelectric material and also the materials for the reflector and electrodes are not limited to those considered here.

The bottom electrode 44 can be divided into separate electrodes 44*a* and 44*b* (not shown in FIG. 4) corresponding to electrodes 41 and 42. The width of the said separate electrodes need not be the same as their corresponding electrodes, neither does the gap between them need to be the same as the gap between the corresponding electrodes.

Figure 6:
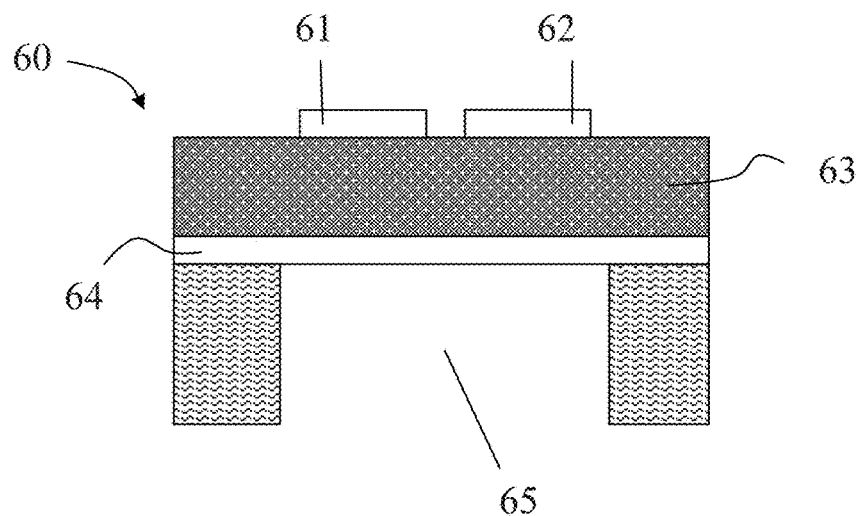
FIG. 6 shows a schematic cross-section of a membrane-type LCRF resonator.

In addition to SMR type structures as shown in FIG. 4, other type structures, e.g. membrane structures 60 as shown in FIG. 6, can be used as well if the acoustic properties are appropriate. FIG. 6 shows membrane structure with two ports 61 and 62 fixed to a piezo 63 atop an electrode 64. Opposed to the SMR, below the electrode 64 there is an air gap 65. Preferably, the width of the air-gap is at least as large as the common width of the resonators 61, 62, as shown in FIG. 6.

Current LCRF filters have been designed to operate in the TE mode, and specifically with the TE1 mode, because many piezoelectric thin film materials have electromechanical coupling stronger in the thickness direction, meaning that the longitudinal vibration couples efficiently to the electrical excitation which is over the thickness of the piezoelectric layer. Due to the lateral topology of the LCRF structure, however, there is a strong coupling to the shear vibration mode as well, as indicated by the strong spurious passband due to the TS2 mode ([3], see above). Therefore, it becomes feasible to also use the TS2 mode to create the electrical frequency response, which is not possible for purely vertical topologies such as the vertical CRF.

According to the present embodiment, both TE1 and TS2 bulk vibration modes are used to form the passband response. This is made possible due to the lateral topology of the structure. The TS2 passband, previously considered a spurious response, is merged into the TE1 passband, leading to at least 2 times as wide passband as obtained with TE1 mode alone. Instead of 2 lateral standing wave resonances (even and odd resonance of the TE1 plate mode), 4 lateral standing wave resonances (even and odd resonances of both the TE1 and TS2 plate modes) can now be used to form the passband (a 4-pole filter response).

Two close-by (in frequency) acoustic plate wave modes are utilized instead of just one, so that 4 lateral standing wave resonances instead of only 2 form the passband (even and odd resonances in both acoustic plate mode branches). This allows for a wider band and relaxed fabrication tolerances. This is made possible by designing the dimensions of the resonators and choosing the materials of the device as a whole in such a way that the plate wave modes attain dispersion characteristics supporting the desired lateral standing wave resonances at suitable frequencies to form a single wide band response. Also, the device geometry is designed to use for example narrow repeated finger like features so that the electromechanical coupling to all of the desired lateral standing wave resonances is high.

Electrical coupling to the shear vibration can be achieved with a material of different piezoelectric symmetry. However, for the invention to produce desired result, the electric field should couple to both shear and longitudinal vibration. Here a material with a strong thickness-directional electromechanical coupling is used with lateral device geometry. Another possibility is a material with strong coupling in both lateral and thickness directions, or a material with strong coupling to lateral direction and vertical excitation geometry.

Figure 1:
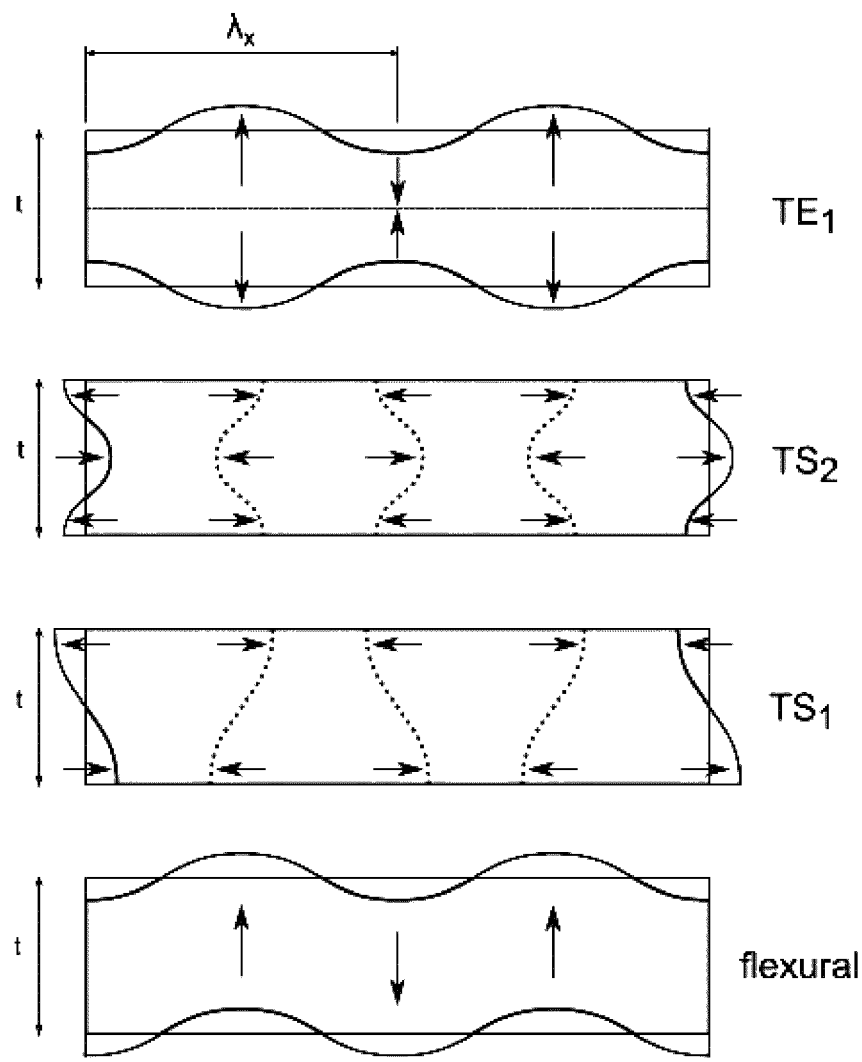
FIG. 1 shows four different laterally propagating thickness waves.
Figure 3:
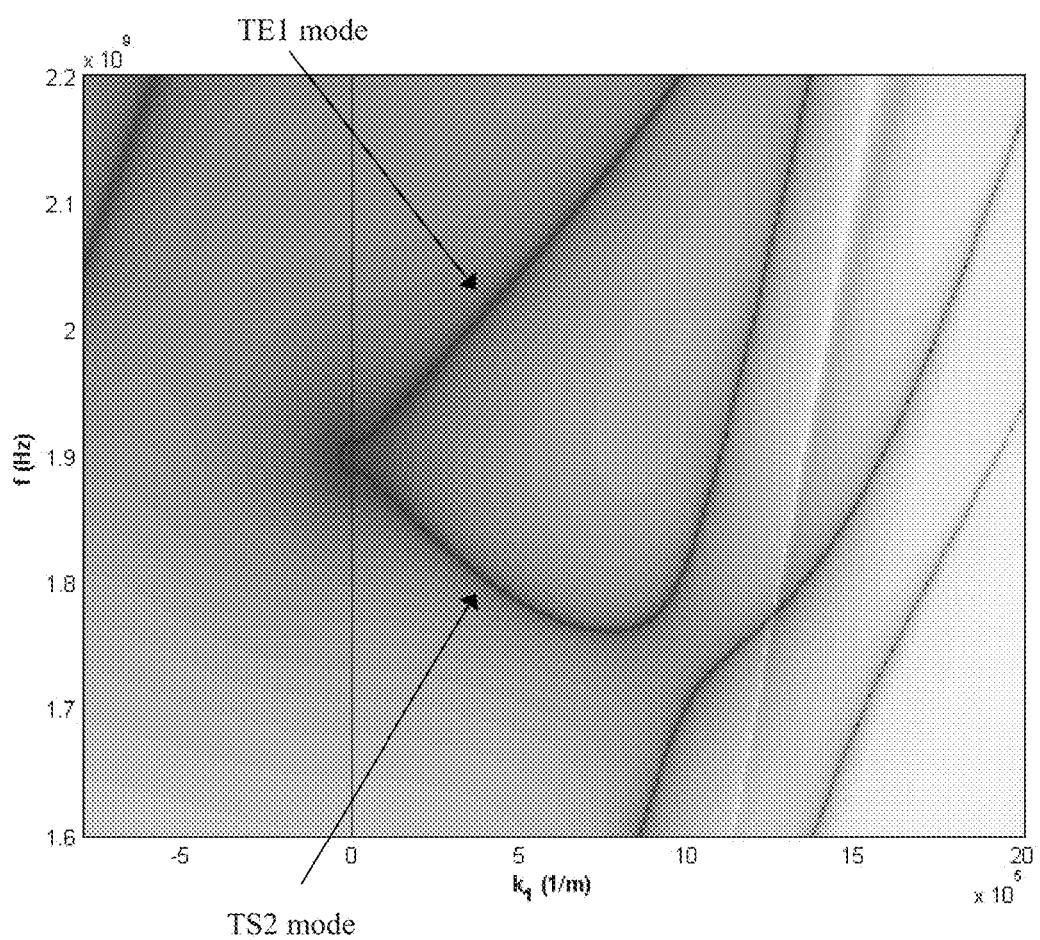
FIG. 3 shows a simulated dispersion diagram for longitudinal TE1 and shear TS2 modes.
Figure 7A:
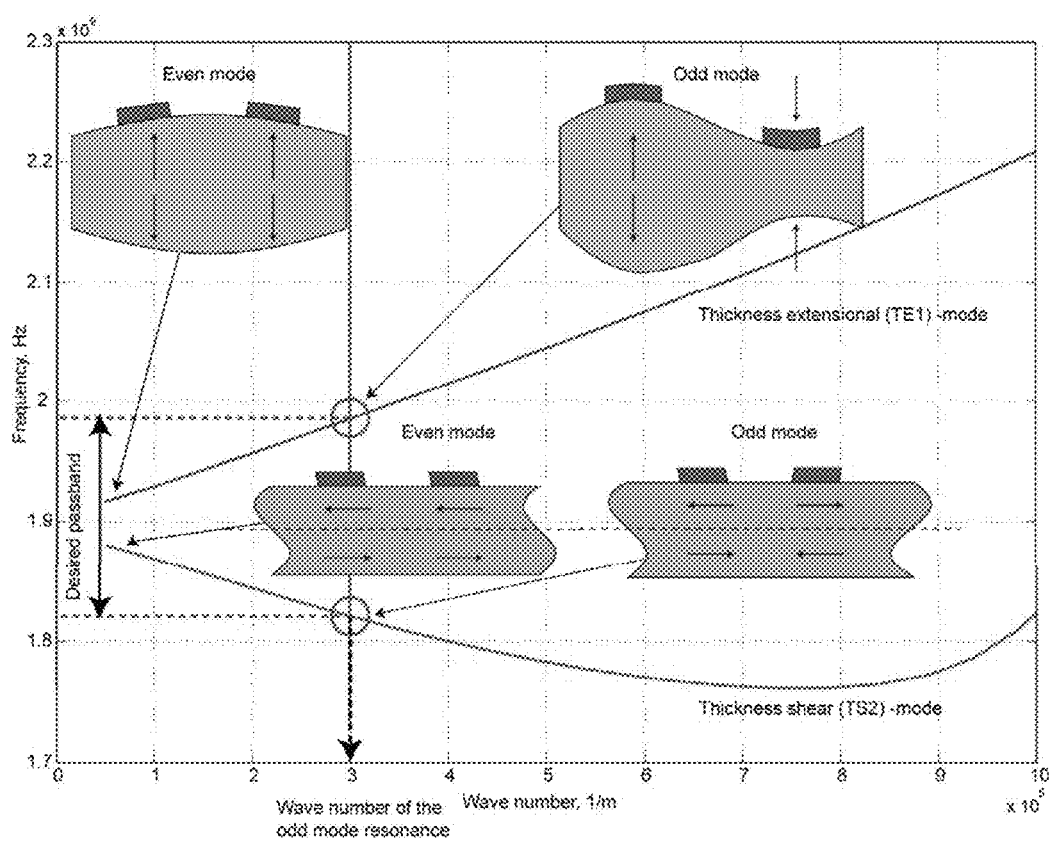
FIG. 7*a* shows simulated dispersion properties of a thin-film stack and schematic illustrations of TE1 and TS2 plate wave modes and respective even and odd lateral resonances for a 2-electrode structure.
Figure 7B:
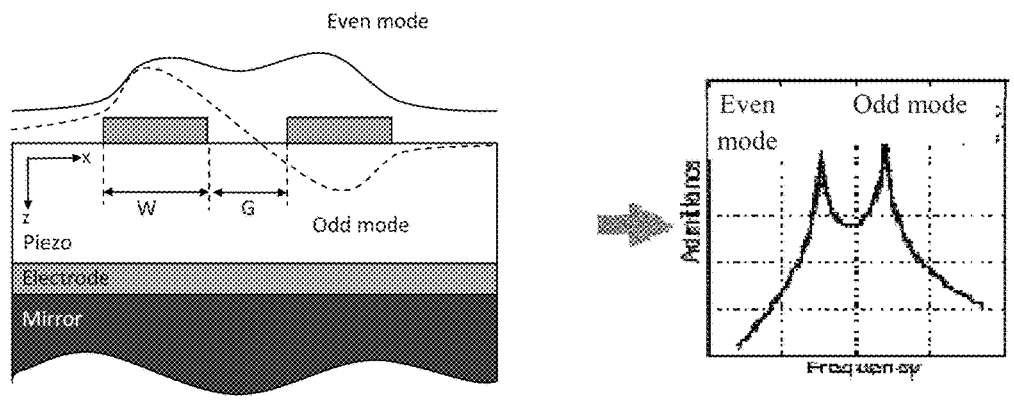
FIG. 7*b* further illustrates the even and odd modes of FIG. 7*a*.

FIG. 7 illustrates the operation principle of the present invention. Simulated dispersion curves from FIG. 3 are shown for the TE1 and TS2 plate wave modes, propagating wave regime. When moving along the dispersion curves, lateral standing wave resonances arise as explained in the previous section. The electrode structure in the example of FIG. 7 is designed so that even and odd lateral standing wave resonances for the two electrodes are trapped for both plate wave modes and they are used to form the passband response.

Figure 8:
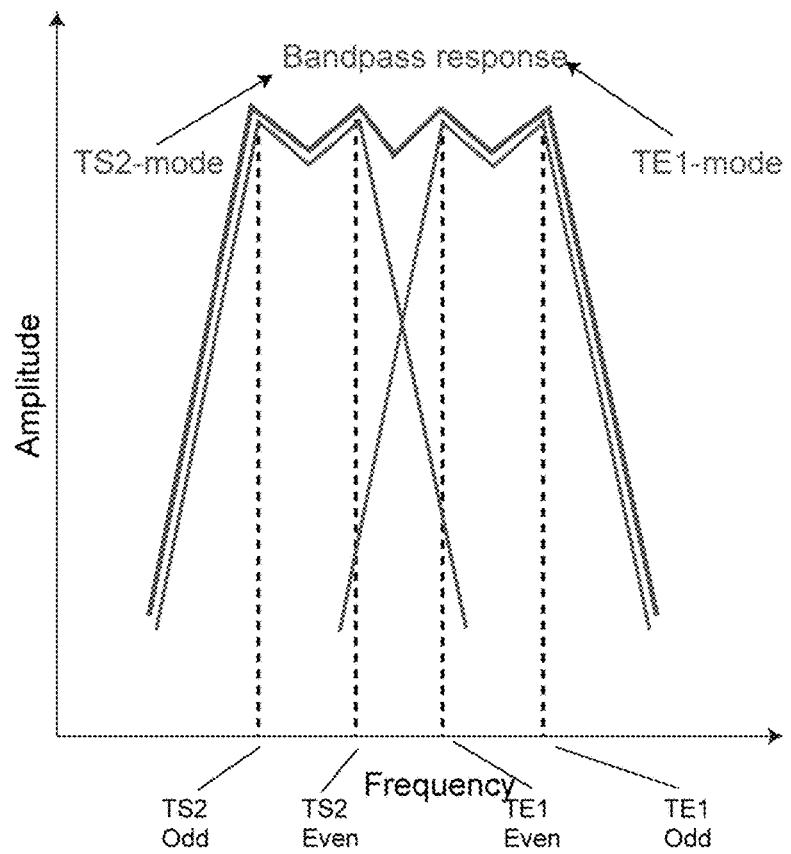
FIG. 8 shows the bandpass response as the combination of 4 lateral standing wave resonances arising for the two distinct TE1 and TS2 plate wave modes.

For the TS2 plate wave mode, the wavelength increases as frequency increases. Therefore, odd resonance arises at a lower frequency than the even resonance. For the TE1 plate wave mode, the order of the even and odd resonances is inverted, as wavelength decreases with increasing frequency. When the acoustic coupling between the electrodes and the frequency differences between the lateral standing wave resonances are correctly designed, a wide-band frequency response can be obtained. Obtainable bandwidth depends on the acoustic properties of the stack and the electrode structure. Rough estimate is that a passband three times wider can be obtained as compared to that available by using the TE1 plate wave mode only (see FIG. 8).

Figure 9:
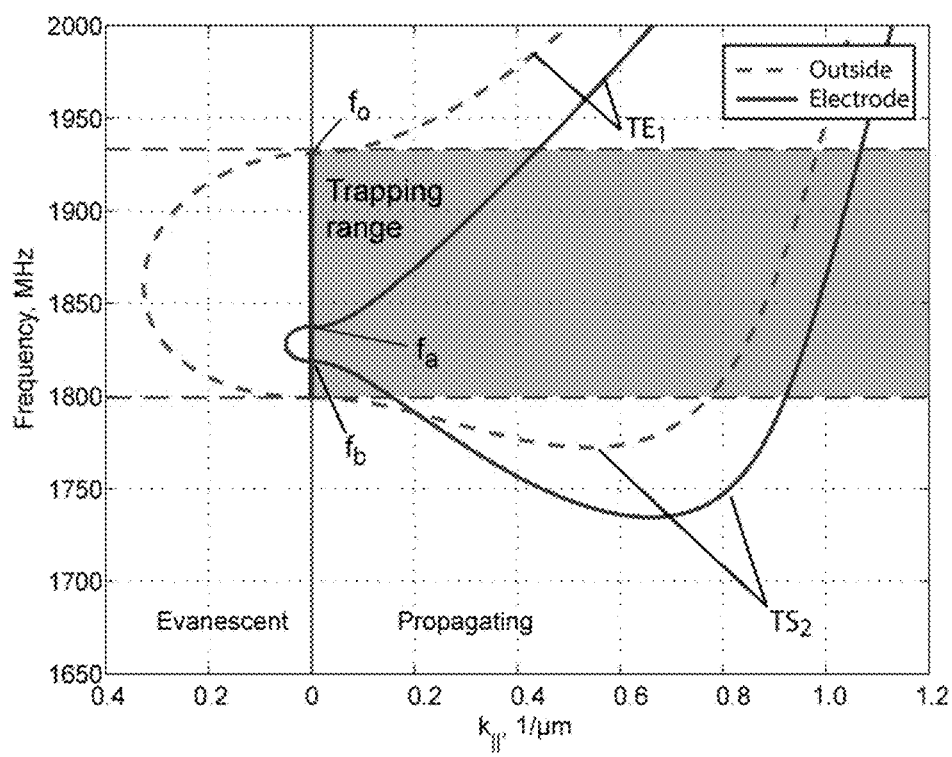
FIG. 9 shows a simulated dispersion diagram.

FIG. 9 is an example of plate wave dispersion in the electrode region (blue, solid curve) and outside the electrodes (red, dashed curve). Values left of k=0 represent imaginary wave vector values and values right of k=0 represent real wave vector values. Acoustic waves in the electrodes are trapped within the electrode region at the frequencies for which the outside region has imaginary wave vector (evanescent wave), marked green/grey in the picture. TE1 and TS2 plate wave modes are indicated for both electrode region and outside region.

The ultimate design rules for the device e.g. in respect of numbers for layer thicknesses etc depends, i.a. on the materials, on the stack, and ultimately on its dispersion. However, in the following description, a set of preferable design requirements are given which can be considered separately or in combination as capable of producing desired effects.

The mass load induced by the top electrode should be small enough to allow the used resonance modes to be included within the frequency trapping range of the laterally propagating plate waves, or to allow the frequency trapping range determined by the evanescent portion of the outside region dispersion curve to enclose the used resonance modes. Therefore, the top electrode should be of a low-density metal, for example Al, and/or thin thickness<$\lambda_z$/4, where $\lambda_z$ is the wavelength of the longitudinal acoustic wave in the thickness (z) direction.

The frequency difference between TS2 and TE1 plate modes' $k_x$=0 frequencies (fb and fa, respectively, in FIG. 9) must be such that the desired passband shape and width is attained.

The bottom electrode also affects the above-mentioned frequency difference. The bottom electrode should be designed so that the frequency difference |fa−fb| is desired, and at the same time, the 1-D electromechanical coupling coefficient $k_{eff}$ of the stack (as measured from a single wide resonator) is large enough to ensure a small losses.

Layer thicknesses in the mirror stack usually has to be <$\lambda_z$/4, where $\lambda_z$ is the wavelength of the longitudinal acoustic wave in the thickness direction, for it to be required that the shear wave is also reflected.

Electrode width is preferably such that one half-wavelength $\lambda_x$ of the lateral acoustic plate wave fits into the electrode at the odd resonance frequency.

Gap width is preferably such that the lateral wavelength $\lambda_x$ of the even lateral resonances due to both TE1 and TS2 plate wave modes are maximized.

The number of electrodes is selected such that the desired frequency bandwidth is reached, and the structure is matched to the system impedance, i.e., its static capacitance is as required for the matching while the length of the electrodes can be kept such that resistive losses are minimized.

Other thickness vibration modes can be used besides the TE1 and TS2. The requirement is that the modes be appropriately spaced in frequency and that suitable lateral standing wave resonances can be created. Also, the TE1 and TS2 modes could be in other order in frequency.

One specific, non-limiting, example is as follows. An interdigital electrode structure was used which had 11 fingers. The width of the electrode was 10 μm and the gap between the electrodes was 2 μm. The electrodes were connected alternating to a first and second port. The thicknesses of the thin film layers are shown in Table 2.

TABLE 2

| Layer | SiO2 | W | SiO2 | W | SiO2 | Mo | AlN | Al |
|---|---|---|---|---|---|---|---|---|
| Thickness (nm) | 790 | 505 | 621 | 507 | 950 | 360 | 1750 | 220 |

The obtained 10 dB bandwidth, using both TE1 and TS2 plate wave modes was approximately 220 MHz, which is 12% of the center frequency of 1850 MHZ, a significant improvement over the current technology.

In order to achieve the desired performance of the present invention, there should be electrical coupling to both longitudinal and shear motion. This is primarily accomplished through the selection of a proper piezoelectric material and device geometry. Additionally, it is preferable that the reflector in any SMR applications reflects both longitudinal and shear waves.

It is also important to select the correct acoustic properties (dispersion). The desired center frequency should be between the onset frequencies of the TE1 and TS2 modes.

Additionally, the frequency difference between TE1 and TS2 modes should be appropriate so that they are trapped in the same structure. The Q value should also be high enough that there is low loss for both TE1 and TS2 modes.

In selecting the proper electrode design, the frequency difference between the even and odd standing wave resonances should be appropriate to give the desired bandwidth. Other factors that should be taken into consideration are that the fabrication tolerances are not critical, that the gaps are sufficiently wide, that there is not too much resistance due to electrode length and that the component size is sufficiently small for its intended use. It is also important to ensure that there are no intermediate lateral standing wave resonances that produce notches in the passband.

The filter of the present invention can also be understood through the method of its design and manufacture. Additionally, a novel method is provided herein.

To design a wide-band acoustically coupled BAW filter which traps at least 4 lateral standing wave resonances a structure and associated materials are chosen such that the electromechanical coupling of two different thickness vibration modes (plate wave modes) is achieved. In the present embodiment the two thickness vibration modes (plate wave modes) are TE1 and TS2, although other vibration modes can be chosen without departing from the scope of the present invention.

Then, the stack is designed so that; the desired center frequency is between the onset ($k_x$=0) frequencies of the plate wave dispersion curves of the two thickness vibration modes, the frequency difference between the onset ($k_x$=0) frequencies of the two vibration modes is approximately one third the desired bandwidth, the Q and $k_{eff}$ are maximized for both modes, and both longitudinal and shear waves are reflected by the reflector layers.

From a dispersion curve, finding the lateral wave number $k_x$ for which the frequency difference between the dispersion curves of the two plate wave modes is approximately the desired bandwidth. This selected $k_x$ value then determines the wavelength at the odd lateral standing wave resonance mode. Knowing the wavelength, it is possible to select an electrode width and gap. If the proper width and gap are not readily apparent, it may be desirable to begin design with a small gap and determine if the coupling must be weakened from that.

By knowing the desired component size and matching requirements it is possible to select the number of electrodes. Large number of electrodes allow for easier matching to 50 Ohms. A large number of electrodes may also reduce the depth of notches arising from weakly coupling lateral resonances. At this stage, the desired design requirements have been chosen and the associated design parameters have been found.

If necessary, parallel or series resonators can be designed to make skirts steeper and the design can be checked for if matching is needed. The shape of the passband can be modified, for example, adding a tuning inductor, if necessary. Afterwards, a wide-band acoustically coupled BAW filter is ready to be manufactured.

While the present invention has been described by specific examples above, they are not meant to limit the scope of the invention to such. The scope of the present invention extends to the use of a shear mode in addition to the longitudinal mode in order to create a wide bandpass response.

Electrical coupling to both thickness plate wave modes can generally be achieved with different combinations of material and excitation geometry not specifically enumerated above. While a strong thickness-direction/weak lateral electromechanical coupling with a lateral device geometry was used it is only one discrete example. Another possibility is strong electromechanical coupling to both thickness and lateral directions or strong lateral/weak thickness-direction electromechanical coupling with a vertical device geometry.

Importantly, the novel use of (at least) 3, in particular at least 4, lateral standing wave resonances instead of 2 enables an extremely wide passband with a simple fabrication process. The wide obtainable band gives enhanced freedom to design such as using wider electrodes, where more electrodes eases the matching to 50 Ohms. Additionally where there is a need to use matching inductances or other matching elements the need is smaller. Requirement to gap width are relaxed which facilitate easier fabrication and better performance (lower losses etc) can be achieved when there is enough bandwidth to sacrifice it a little.

In a three-resonances system the resonances two of the resonances may arise for one plate wave mode and one of the resonances arise for another plate wave mode.

According to one embodiment, the piezoelectric layer is selected from symmetry group 6 mm, with their c-axis in vertical direction According to one embodiment, the piezoelectric layer is selected from symmetry group 6 mm, with its c-axis in tilted orientation with respect to vertical direction. In this case, a vertical electric field is coupled to both longitudinal acoustic wave (e.g. TE1) and shear wave (e.g. TS2).

Generally speaking, the symmetry group and crystal orientation of the piezoactive layer may also be selected so as to form an intrinsic coupling with vertical electric field in both longitudinal (e.g. TE1) and transverse acoustic modes (e.g. TS2).

The acoustic filter may also comprise two or more piezoactive layers in stacked configuration. In that case the standing wave modes occur along the stack, i.e. in the vertical direction.

Alternative materials solutions can be used to provide the coupling to the shear vibration. One example is using 6 mm material, such as AlN or ZnO, deposited such that the c-axis is inclined from the vertical direction, and coupling of vertical electric field to vertically propagating shear acoustic vibration is provided. Another example is using thin-film form of piezoelectric materials such as LiNbO3, LiTaO3. Another example is using a material that provides intrinsically the coupling of vertical electric field to vertically propagating shear acoustic vibration.

The invention claimed is:

1. An acoustic filter comprising;
a stack of materials suitable for an acoustic filter, the stack comprising at least one piezoelectric layer,
at least two resonators having a width and a gap between them and comprising electrodes on different sides of the piezoelectric layer, where the electrodes on at least one side of the piezoelectric layer are separated to form at least two resonator regions, and
wherein the stack of materials, width and gap between the separated electrodes being adapted to produce at least two distinct acoustic plate wave modes, each acoustic plate wave mode contributing at least one lateral standing wave resonance in the acoustic filter, wherein the acoustic filter is adapted to trap at least two distinct plate wave modes having a total of at least three lateral standing wave resonances in the acoustic filter.

2. The acoustic filter according to claim 1, wherein the electrodes on only one side of the piezoelectric layer are separated to form at least two resonator regions and there is provided a continuous electrode on the other side of the piezoelectric layer.

3. The acoustic filter according to claim 1, wherein the electrodes on both sides of the piezoelectric layer are separated to form at least two resonator regions.

4. The acoustic filter according to claim 3, wherein at least two of the electrodes are electrically connected to provide a balanced electrical port.

5. The acoustic filter according to claim 1, wherein at least two of said at least three lateral standing wave resonances arise for one plate wave mode and at least one of said at least three lateral standing wave resonances arise for another plate wave mode.

6. The acoustic filter according to claim 1, wherein the acoustic filter is adapted to trap at least two distinct plate wave modes having a total of at least four lateral standing wave resonances in the acoustic filter.

7. The acoustic filter according to claim 1, wherein the at least two distinct acoustic plate wave modes comprising at least one longitudinal mode and at least one shear mode.

8. The acoustic filter according to claim 1, further comprising at least two piezoelectric layers in stacked configuration.

9. The acoustic filter according to claim 1, wherein the piezoelectric layer(s) is (are) selected from symmetry group 6 mm, with their c-axis in vertical direction.

10. The acoustic filter according to claim 1, wherein the piezoelectric layer is formed from AlN or ZnO.

* * * * *